United States Patent [19]
Murari et al.

[11] Patent Number: 5,150,073
[45] Date of Patent: Sep. 22, 1992

[54] LOW-NOISE PREAMPLIFIER STAGE, IN PARTICULAR FOR MAGNETIC HEADS

[76] Inventors: Bruno Murari, Via Ardigò 1, 20052 Monza, Province of Milan; Domenico Rossi, Via Roma 161, 27024 Cilavegna, Province of Pavia; Pierantonio Savino, Via D. Alighieri 3, 20080 Casarile, Province of Milano, all of Italy

[21] Appl. No.: 628,023

[22] Filed: Dec. 17, 1990

[30] Foreign Application Priority Data

Dec. 22, 1989 [IT] Italy .................................. 22819 A/89

[51] Int. Cl.$^5$ .................................................. H03F 3/45
[52] U.S. Cl. .................................. 330/261; 330/260; 330/259; 360/68
[58] Field of Search ............... 330/260, 261, 159, 108; 360/66, 68

[56] References Cited

U.S. PATENT DOCUMENTS

| | | | |
|---|---|---|---|
| 3,631,356 | 12/1971 | Aschermann | 330/261 |
| 3,668,430 | 6/1972 | Kan | 330/260 |
| 4,468,628 | 8/1984 | Gross | 330/260 |

FOREIGN PATENT DOCUMENTS

| | | | |
|---|---|---|---|
| 58-36004 | 3/1983 | Japan | 330/261 |
| 58-103212 | 6/1983 | Japan | 330/261 |
| 59-126308 | 7/1984 | Japan | 330/261 |

*Primary Examiner*—Eugene R. LaRoche
*Assistant Examiner*—Tan Dinh
*Attorney, Agent, or Firm*—Townsend & Townsend

[57] ABSTRACT

A low-noise preamplifier stage, in particular for magnetic heads, which comprises an input stage comprising a differential circuit and a single-transistor output stage, wherein the differential stage has an intrinsic offset voltage, is ground-connectable and can be directly coupled to the magnetic head, the two transistors forming the differential circuit having different bias currents in order to reduce the input equivalent noise, the base terminal of the first transistor of the differential circuit defining an input of the stage which can be connected directly to a terminal of the magnetic head, the other terminal of the head being connected directly to the ground, the base terminal of the other transistor of the different circuit being connected to the intermediate point of a pair of resistors which are mutually connected in series between the single transistor of the output stage and a line at reference voltage, so that the differential stage biases the output with its offset voltage without requiring additional components for this purpose.

6 Claims, 1 Drawing Sheet

LOW-NOISE PREAMPLIFIER STAGE, IN PARTICULAR FOR MAGNETIC HEADS

BACKGROUND OF THE INVENTION

The present invention relates to a low-noise preamplifier stage, in particular for magnetic heads. More in particular, the present invention relates to a preamplifier stage which has a ground-connectable input and can be directly coupled to the magnetic head.

Generic preamplifier stages in various configurations are known. However, none of these configurations fully and simultaneously meets all the requirements of the specific application.

For example, in the development of a preamplifier stage for the described application, a configuration which comprises an output stage provided via an NPN transistor driven by a single-transistor stage, also of the NPN type, has been studied. A possible circuital solution based on this configuration is shown in FIG. 1. In this figure, $T_2$ indicates the output transistor and $T_1$ indicates the input transistor, $R_1$ and $R_2$ are used to define the value of the total gain of the stage, and $V_{REF}$ is the bias voltage required to appropriately bias the output (due to the single-transistor structure of the output stage), such auxiliary voltage being applied to the base of the transistor $T_1$ via resistor R. The capacitor C provides an alternative-current path through which the input signal can be applied, and has therefore a terminal connected to the base of $T_1$ and the other terminal arranged so as to define the input IN of the stage.

This stage meets the requirement of low noise, since the total noise of the stage is predominantly due to a single transistor, i.e. to $T_1$, whereas the noise due to the transistor $T_2$ can be ignored, since it is returned to the input divided by the amplification of the first stage (which includes $T_1$).

However, this stage is not ground-connectable, cannot be directly coupled and furthermore has additional problems related to the assignment of the values of R and C. R and C in fact must be given values so that the virtual high-pass filter which they form allows the passage of the audio signal $V_{IN}$ applied to the input, i.e. so that the time constant $$\tau = R \cdot C$$

of said filter is large enough. However, R cannot have a high value in order to avoid deteriorating the stage input noise. For a given value of the time constant, it is therefore necessary to choose a high capacity value C, and this causes a considerable increase in the cost of the overall system.

In order to overcome the above described problems, a different configuration, which uses a differential stage for the input stage, has been developed. The related circuital solution is shown in FIG. 2, in which $T_1$ again indicates the input transistor, $R_1$ and $R_2$ again indicate the resistors which set the gain of the stage, and the differential stage is formed by two identical PNP transistors indicated by $T_3$, $T_4$. In particular, the two coupled emitters of $T_3$, $T_4$ are connected to a current source, indicated by 2I, and their collectors are connected to the ground via respective resistors $R_3$, $R_4$. The base of $T_4$ is connected to the intermediate point between $R_1$ and $R_2$, whereas the base of $T_3$ is connected to an inductor L which represents the magnetic head, the other terminal whereof must be connected to a reference voltage $V_{REF}$.

A direct coupling is therefore obtained in this solution, but it is still necessary to provide for an auxiliary voltage source to obtain the voltage $V_{REF}$ required to bias the output to a value higher than that defined by the ground. This entails the known problems related to greater structural complication, to the presence of drifts, etc. Furthermore and most of all, this structure entails a considerable deterioration of the noise performance with respect to the circuit of FIG. 1. In fact, by setting $T_3$ and $T_4$ to an equal current level and optimizing the structure for the source resistance, indicating the input equivalent noise source of $T_3$ with $e_{n1}$, and assuming, for the sake of simplicity, that only the transistors produce noise, the total noise of the stage is:

$$e_{ni} = \sqrt{e_{n1}^2 + e_{n2}^2} = 1.4 \cdot e_{n1}$$

SUMMARY OF THE INVENTION

Given this situation, the aim of the present invention is to provide a low-noise preamplifier stage, in particular for magnetic heads, which solves the disadvantages of the known art.

Within the scope of this aim, a particular object of the present invention is to provide a preamplifier stage which has a ground-connectable input.

An important object of the present invention is to provide a preamplifier stage of the indicated type which can be directly coupled.

Not least object of the present invention is to provide a preamplifier stage of the indicated type which has a simple circuital structure, with a limited number of components, in particular it does not require the presence of a source of a reference voltage differing from the supply voltage and from the ground or high-value capacitors, and is consequently reliable and can be economically manufactured and even integrated.

This aim, the objects mentioned and others which will become apparent hereinafter are achieved by a low-noise preamplifier stage, in particular for magnetic heads, as defined in the accompanying claims.

BRIEF DESCRIPTION OF THE DRAWINGS

The characteristics and advantages of the invention will become apparent from the description of a preferred embodiment, illustrated only by way of non-limitative example in the accompanying drawings, wherein.

DESCRIPTION OF THE PREFERRED EMBODIMENTS

Figure 1:
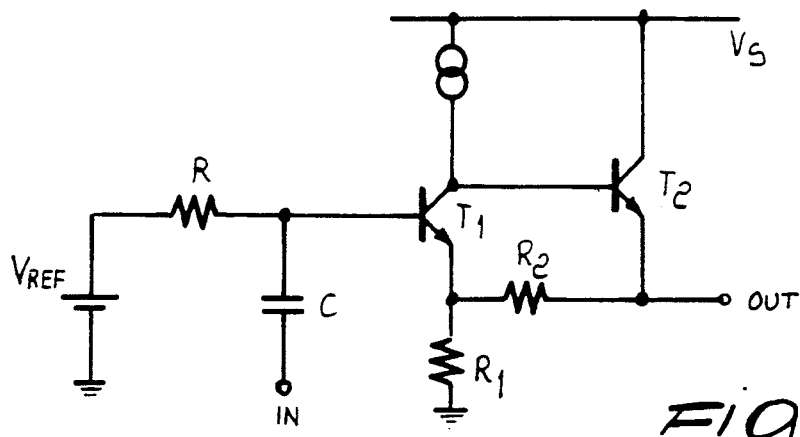
FIG. 1 is a circuit diagram of a preamplifier with a single-transistor input stage.
Figure 2:
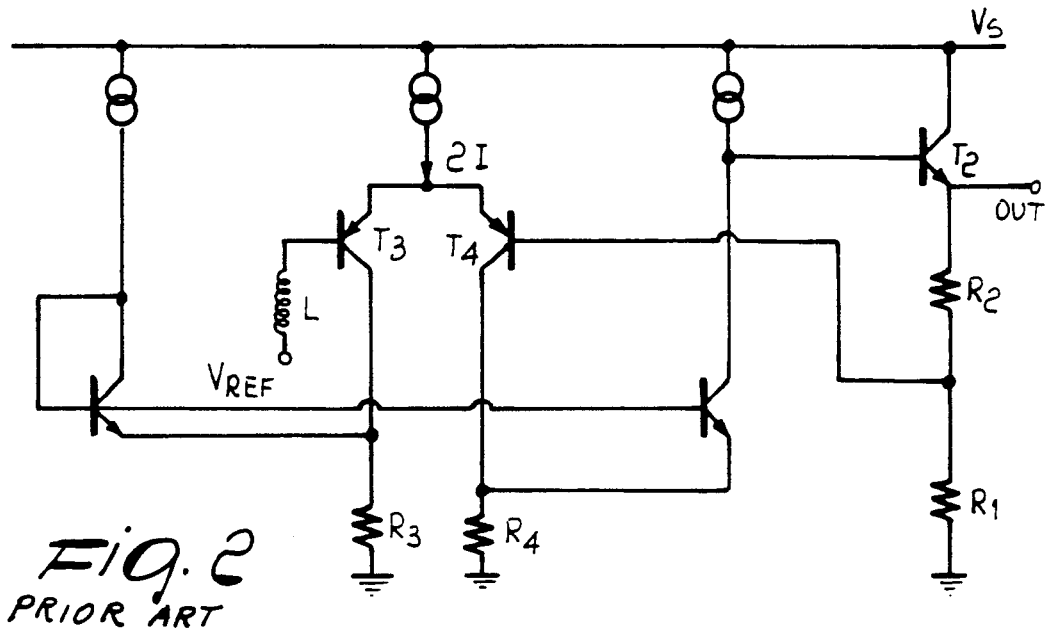
FIG. 2 is a circuit diagram of a preamplifier with an input stage which comprises a differential stage.

FIGS. 1 and 2 are not described hereinafter; reference is made to the above description for said figures.

Figure 3:
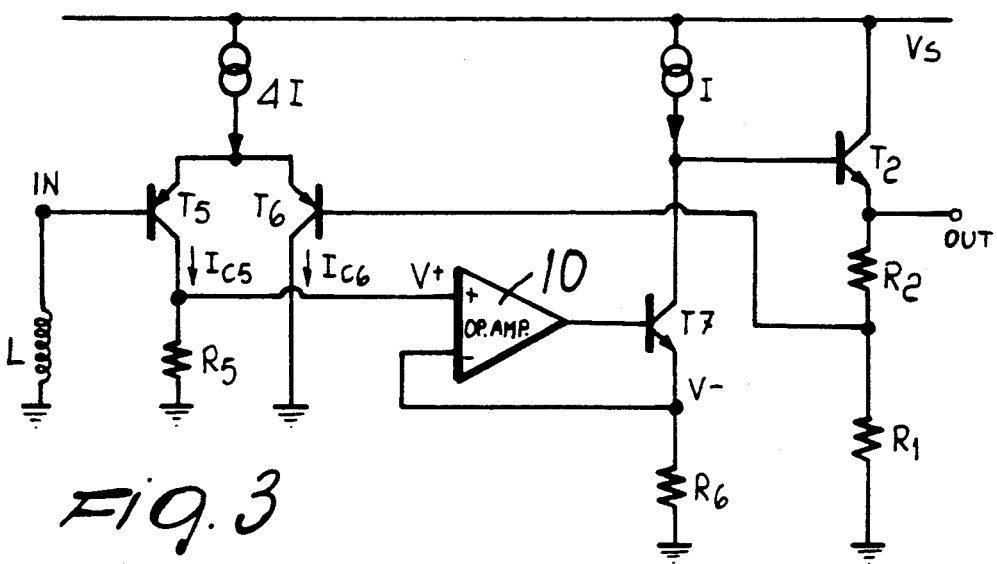
FIG. 3 is a circuit diagram of the preamplifier stage according to the invention.

With reference to FIG. 3, the preamplifier stage according to the invention comprises an output transistor of the NPN type, again indicated by $T_2$, and an input stage provided by means of a differential stage which comprises a pair of PNP transistors $T_5$ and $T_6$. The output transistor $T_2$ is connected, as in the solutions according to FIGS. 1 and 2, to the supply voltage $V_s$ with its collector, and to the ground with its emitter through the resistors $R_1$, $R_2$, which are mutually connected in series and determine the gain of the stage in this case as well. The base of $T_2$ is connected to a current source I which is connected to the power supply $V_s$ with its other terminal. The same terminal of the current source I which is connected to the base of $T_2$ is also connected to the collector of a NPN transistor $T_7$, the emitter whereof is connected to the ground through the resistor $R_6$ and the base whereof is connected to the output of an operational amplifier 10. The inverting input of the amplifier 10 is connected to the emitter of $T_7$ (and therefore to the terminal of $R_6$ which is not connected to the ground), whereas its non-inverting input is connected to the collector of $T_5$, which is also connected to a terminal of a resistor $R_5$. The collector of $T_6$ is instead connected directly to the ground. The coupled emitters of $T_5$, $T_6$ are connected to a current source of appropriate value, which delivers, in the specific embodiment, the current 4I and is arranged between the differential stage $T_5$, $T_6$ and the power supply $V_s$. The base of $T_6$ is connected to the intermediate point between $R_1$ and $R_2$, so as to bias the output, whereas the base of $T_5$ is connected to a terminal of the head, which is schematically represented by the inductor L, whereas the other terminal of the head is connected directly to the ground.

According to the invention, the transistors $T_5$, $T_6$ are provided with different areas (and specifically the emitter area of $T_6$ is at least three times larger than that of $T_5$, e.g. ten times larger), but in all other respects they are identical transistors, so that the bias current which flows through them is different. The resistors $R_5$, $R_6$ are furthermore mutually identical.

The operation of the circuit of FIG. 3 is as follows: assuming the amplifier 10 is ideal, its inputs are at the same voltage, i.e. $V^+ = V^-$, so that the drop on $R_5$ is equal to the drop on $R_6$. Since these two resistors are identical, the current which flows through $R_5$ (and therefore the collector current of $T_5$) is equal to the current I which is set by the source I and flows through $R_6$. Consequently, $T_6$ is crossed by a current equal to 3I, i.e. to the difference between the current supplied by the source 4I and the current drawn by $T_5$. Since $T_5$ and $T_6$ are identical apart from the emitter areas, the stage has an intrinsic offset voltage equal to $$V_{OFF} = \frac{KT}{q} \ln \frac{I_{C6}}{I_{C5}}$$

where $I_{C5}$ and $I_{C6}$ are the collector currents of $T_5$, $T_6$ respectively.

This offset, multiplied by $(R_1+R_2)/R_1$, which is the gain of the stage, provides the bias required by the non-zero output, without using auxiliary voltages.

The head L can consequently be directly and continuously coupled to the base of $T_5$ with one of its terminals and directly to the ground with its other terminal.

The circuit according to the invention has a lower equivalent noise than the circuit illustrated in FIG. 2. As is known, the equivalent noise voltage of a voltage-controlled transistor is in fact inversely proportional to the bias current. Therefore, by biasing $T_6$ with a current which is higher (and specifically three times higher) than the bias current of $T_5$, its contribution to the equivalent noise voltage is smaller than that of $T_5$. In particular, indicating the source of equivalent noise in input to $T_5$ again with $e_{n1}$, via the circuit according to the invention it is possible to obtain a total equivalent input noise which is significantly smaller that $1.4\ e_{n1}$.

As can be seen from the above description, the invention fully achieves the intended aim and objects. A stage has in fact been provided which, as explained above, by virtue of the use of a differential stage the transistors whereof have different bias currents, has a noise level which is not excessive and in any case adequate for the use. The use of two transistors with different bias currents gives the differential stage an intrinsic offset which can be used to bias the output, without the need for specifically provided components, so that the stage according to the invention is simpler and more reliable. A further consequence of the absence of reference voltages is the fact that the head L can be connected directly between the input of the stage IN and the ground. The circuit is furthermore completely ground-connectable, since it can operate perfectly even when the input IN is at the ground voltage or even slightly below it (provided that it is within the linear operating range of the transistor $T_5$). Finally, components which require such dimensionings as to entail actual manufacturing problems are not required, and the stage can be easily integrated.

The invention thus conceived is susceptible to numerous modifications and variations, all of which are within the scope of the inventive concept. In particular, the fact is stressed that the value of the bias source of the differential stage and the area ratio between $T_5$ and $T_6$ depend on the required bias of the output and can therefore vary according to the requirements. Similarly, the bias of the input transistor $T_5$ to the required value can be obtained in different manners, and the multiplication ratio between $R_5$ and $R_6$, which is equal to one in this embodiment, can also be chosen differently.

All the details may furthermore be replaced with other technically equivalent elements.

We claim:

1. A low-noise preamplifier stage circuit, in particular for magnetic heads, comprising an input stage which includes a differential circuit formed by a first transistor and by a second transistor with coupled emitters and a single-transistor output stage, the emitter area of said second transistor being a multiple of the emitter area of said first transistor whereby said first transistor and said second transistor of the differential circuit have different bias currents with the bias current of said second transistor being higher than the bias current of said first transistor, generating an intrinsic offset voltage between the respective base terminals, the base terminal of said first transistor defining an input of the stage and the base terminal of said second transistor being connected to an intermediate point of a pair of resistors, said resistors being mutually coupled in series between said single transistor of the output stage and a line at reference voltage, so as to bias said output stage with said offset voltage, said input stage having a first current source which is connected to said coupled emitters of said first transistor and said second transistor of the input stage, said first current source generating a current which is a multiple of the bias current of said first transistor, said input stage furthermore comprising a branch for setting the bias current of said first transistor, said branch comprising a second current source suitable for generating a current having a preset value, and current source means which are connected to the collector terminal of said first transistor, said current source means being controlled by said setting branch so as to generate said bias current of said first transistor, said second transistor being biased at a current which is equal in value to the difference between the current generated by said first current source and the bias current of said first transistor, said controlled current source means comprising a bias resistor which is connected between the collector terminal of said first transistor and said line at reference voltage, said circuit further comprising an operational amplifier which has a first input connected to the intermediate point between said bias resistor and said first transistor and a second input connected to a terminal of a further resistor which is connected between said second current source and said line at reference voltage, the output of said operational amplifier being connected to the base terminal of a further transistor, said further transistor being connected, with its collector and emitter terminals, between said second current source and said further resistor.

2. The circuit according to claim 1, wherein said input of said circuit can be connected to a terminal of an inductive element, said inductive element constituting in particular said magnetic head, said inductive element having its other terminal connected directly to said line at reference voltage.

3. The circuit according to claim 2, wherein said first transistor and said second transistor of the differential stage are of PNP type, said single transistor of the output stage and said further transistor being of NPN type.

4. A circuit for coupling a magnetic head to an amplifier comprising a differential circuit including a first bipolar transistor and a second bipolar transistor each having an emitter, a base, and a collector, an input terminal connected to the base of said first bipolar transistor, a first current source connected to the emitters of said first bipolar transistor and said second bipolar transistor and providing a first current through said first bipolar transistor and a second current through said second bipolar transistor with said first current and said second current being unequal, the ratio of said first current to said second current being related to the ratio of the emitter area of said first bipolar transistor to the emitter area of said second bipolar transistor, first resistor means connecting the collector of said first bipolar transistor to a first voltage potential and means connecting the collector of said second bipolar transistor to said first voltage potential, an output bipolar transistor having an emitter, a base, and a collector, the collector of said output bipolar transistor connected to a second voltage potential, and the emitter of said output bipolar transistor connected to an output terminal, second and third serially connected resistors connecting said emitter of said output bipolar transistor to said first voltage potential, said second and third resistors having a common terminal, means connecting the base of said second bipolar transistor to said common terminal, biasing means connected to the base of said output bipolar transistor including a second current source, a fourth bipolar transistor, and a fourth resistor serially connected between said first voltage potential and said second voltage potential, and an operational amplifier having an output connected to the base of said fourth bipolar transistor, a first input connected a common terminal of said first bipolar transistor and said first resistor, and a second input connected to a common terminal of said fourth bipolar transistor and said fourth resistor, and means connecting the collector of said fourth bipolar transistor to said base of said output bipolar transistor.

5. The circuit as defined by claim 4 wherein said emitter area of said second bipolar transistor is a multiple larger than said emitter area of said first bipolar transistor.

6. The circuit as defined by claim 5 wherein said first bipolar transistor and said second bipolar transistor are PNP type, and said output transistor is NPN type.

* * * * *